United States Patent
Lindbom et al.

(10) Patent No.: US 6,970,520 B1
(45) Date of Patent: Nov. 29, 2005

(54) METHODS AND SYSTEMS FOR ACCUMULATING METRICS GENERATED BY A SEQUENCE ESTIMATION ALGORITHM

(75) Inventors: Lars Lindbom, Karlsbad (SE); Magnus Falkenström, Vålberg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 1021 days.

(21) Appl. No.: 09/709,341

(22) Filed: Nov. 13, 2000

(51) Int. Cl.$^7$ .............................. H03D 1/00; H04L 27/06
(52) U.S. Cl. ...................... 375/340; 714/792; 714/794; 714/795; 375/262; 375/341; 704/242
(58) Field of Search ................................ 375/262, 340, 375/341

(56) References Cited

U.S. PATENT DOCUMENTS

| | | | |
|---|---|---|---|
| 4,644,564 A | * 2/1987 | Dolivo et al. | 375/291 |
| 5,164,961 A | 11/1992 | Gudmundson | |
| 5,297,169 A | 3/1994 | Backström et al. | |
| 5,375,129 A | * 12/1994 | Cooper | 714/795 |
| 5,436,928 A | * 7/1995 | Fukuawa et al. | 375/232 |
| 5,465,276 A | 11/1995 | Larsson et al. | |
| 5,481,572 A | 1/1996 | Sköld et al. | |
| 5,499,272 A | 3/1996 | Bottomley | |
| 5,533,067 A | 7/1996 | Jamal et al. | |
| 5,596,607 A | 1/1997 | Larsson et al. | |
| 5,727,032 A | * 3/1998 | Jamal et al. | 375/347 |
| 5,903,610 A | 5/1999 | Sköld et al. | |
| 5,930,298 A | * 7/1999 | Choi | 375/262 |
| 6,023,492 A | 2/2000 | Norman | |
| 6,141,388 A | * 10/2000 | Servais et al. | 375/262 |
| 6,192,038 B1 | * 2/2001 | Wallerius et al. | 370/328 |
| 6,215,827 B1 | * 4/2001 | Balachandran et al. | 375/262 |
| 6,272,661 B1 | * 8/2001 | Yamaguchi | 714/795 |
| 6,278,732 B1 | * 8/2001 | Beidas et al. | 375/235 |
| 6,452,984 B1 | * 9/2002 | Banister et al. | 375/341 |
| 6,597,743 B1 | * 7/2003 | Khayrallah et al. | 375/265 |
| 6,606,728 B1 | * 8/2003 | Aziz | 714/792 |

FOREIGN PATENT DOCUMENTS

| | | |
|---|---|---|
| EP | 0 677 965 A2 | 10/1995 |
| EP | 0 786 872 A2 | 7/1997 |

OTHER PUBLICATIONS

Adaptive Maximum–Likelihood Receiver for Carrier–Modulated Data–Transmission Systems Ungerboeck, G.; Communications, IEEE Transactions on [legacy, pre–1988], vol.:22, Issue: 5, May 1974 pp.: 624–636.*

(Continued)

Primary Examiner—Stephen Chin
Assistant Examiner—Harry Vartanian

(57) ABSTRACT

Radiocommunication systems, methods and terminals are described wherein metrics associated with MLSE detecting techniques, e.g., using the Viterbi algorithm, are accumulated in a manner which is less computationally intensive than conventional techniques. The delta metrics associated with each state are partitioned into, for example, six different terms. These terms are then selectively accumulated in phases, before decisions, during decisions and after decisions, to reduce the total number of computations associated therewith. Additionally, certain symmetries associated with exemplary modulations are taken into account in order to further simplify processing and memory requirements of these detecting techniques.

28 Claims, 6 Drawing Sheets

OTHER PUBLICATIONS

Performance of list Viterbi equalizers with metric–criteria combining Kubo, H.; Tanada, K.; Iwase, A.; Penther, B.; Miyake, M.; Vehicular Technology Conference Proceedings, 2000. VTC 2000–Spring Tokyo. 2000 IEEE 51st, vol.: 3, May 15–18, 2000 pp.: 186.*

Difference–metric Viterbi decoding of multilevel class–IV partial–response signals Olcer, S.; Underboeck, G.; Communications, IEEE Transactions on, vol.: 42, Issue: 234, Feb./Mar./Apr. 1994 pp. :1558–1570.*

On the optimality of metrics for coarse frame synchronization in OFDM: a comparison Muller–Weinfurtner, S.H.; Personal, Indoor and Mobile Radio Communications, 1998. The Ninth IEEE International Symposium on, vol.:2, Sep. 8–11, 1998 pp.:533–537 v.*

* cited by examiner

METHODS AND SYSTEMS FOR ACCUMULATING METRICS GENERATED BY A SEQUENCE ESTIMATION ALGORITHM

BACKGROUND

The present invention pertains to methods and systems involved in sequence estimation algorithms and, more particularly, to methods and systems for efficiently accumulating metrics associated with a sequence estimation algorithm, e.g., as part of the process of detecting radio signals.

The cellular telephone industry has made phenomenal strides in commercial operations in the United States as well as the rest of the world. Growth in major metropolitan areas has far exceeded expectations and is rapidly outstripping system capacity. If this trend continues, the effects of this industry's growth will soon reach even the smallest markets. Innovative solutions are required to meet these increasing capacity needs as well as maintain high quality service and avoid rising prices.

In mobile communication, the transmitted signal is often subjected to a time smearing effect created by the time dispersive nature of the channel, i.e., the air interface between a base station and a mobile station. The channel effects are estimated in the receiver part of a communication system, and used by the detector to aid in attempting to correctly deduce the information symbols that were transmitted thereto. A commonly used technique for deducing such received information symbols is known as Maximum Likelihood Sequence Estimation (MLSE) which, implemented using the Viterbi algorithm, is optimal for situations involving Additive While Gaussian Noise (AWGN).

An MLSE detector operates by selecting a known bit sequence closest to a received bit sequence. Because $2^k$ bit sequences are involved (k being the number of data bits within a frame) in a typical MLSE detector, the system stores the $2^k$ sequences for comparison with a received bit sequence. For a large value of k, this can be unwieldy. Viterbi simplified the maximum likelihood evaluation by noting that each of the states represented has only a finite number of possible predecessor states, and that only the path that agrees most with the received sequence (the minimum distance path) need be retained for each state. Trellis diagrams are commonly used to illustrate the concepts of paths and states associated with MLSE detecting, an example of which is provided as FIG. 1. For the simple four state trellis diagram depicted in FIG. 1, the characteristic used by Viterbi to simplify maximum likelihood evaluation may be understood by considering that each of the four states (00, 01, 10 and 11) has only two possible predecessor states, e.g., you can only reach the 00 state from a previous 00 state or a 10 state. Viterbi recognized that the likelihood evaluation could be significantly enhanced by using this factor in assessing possible paths through a trellis diagram.

Each possible path, or combination of state transitions, has an associated likelihood, or probability, of being correct. The probability of any given transition is based on a newly received value, in view of a succession of predecessor values. These transition probabilities are commonly referred to as metrics, and a succession of metrics are referred to as a path metric denoting the likelihood of a sequence of possible state transitions. Exemplary algorithms for computing metrics are discussed in detail below. However, it will be appreciated by those skilled in the art that the accumulation of metrics during MLSE detecting is a rather computationally intensive function. Since processing resources continue to be a valuable commodity in today's electronic devices, system designers have sought for ways to decrease the computational intensity of MLSE detecting without sacrificing quality.

One method for addressing this problem is described in an article authored by G. Ungerboeck, entitled "Adaptive Maximum Likelihood Receiver for Carrier Modulated Data Transmission Systems," *IEEE Trans. Commun.*, vol. COM-22, no. 4, pp. 624–535, May 1974, which applies two steps to reduce complexity. The first step is to expand the magnitude square term found in the metric computations and to eliminate terns that are common to all hypotheses. As a simple example, the term $(a-b)^2$ can be expanded into $a^2-2ab+b^2$. If "a" does not depend on the hypothesized data, then the $a^2$ term can be dropped from the metric computation.

The second step described by Ungerboeck is to re-arrange the order of the metric computations. With standard MLSE detecting, metrics are computed and updated based on successively received data samples. Each iteration of the Viterbi algorithm corresponds to a new received data sample. Using the second step as described by Ungerboeck, each iteration of the Viterbi algorithm corresponds to a newly transmitted symbol.

Another approach to reducing the complexity associated with the MLSE detecting is described in U.S. Pat. No. 5,499,272, entitled "Diversity Receiver for Signals with Multipath Time Dispersion", to G. Bottomley, the disclosure of which is incorporated here by reference. Therein, joint MLSE detecting and diversity combining can be performed using a variant Ungerboeck form by expanding the metric expressions and collecting terms that correspond to the same hypothesized symbol.

Although MLSE detectors have been implemented through computationally efficient Viterbi schemes, e.g., using the Ungerboeck or variant Ungerboeck techniques described above, the MLSE detector might still be very computationally complex if large symbol alphabets are employed or if the number of required taps in the channel estimate is large. Both of these possibilities become more likely with next generation systems, e.g., EDGE which may employ 8-PSK modulation and a larger number of channel taps.

Accordingly, it continues to be desirable to make sequence estimation calculations more computationally efficient and to design detectors that will have a reduced MIPS requirement so as to free computational resources for other functionality.

SUMMARY

These and other drawbacks and limitations of conventional detecting techniques are overcome according to exemplary embodiments of the present invention, wherein, according to a first exemplary aspect of the present invention, the addition of old survivor (i.e., accumulated) metrics and delta metrics is reordered in a manner which makes the calculations more computationally efficient. According to a second exemplary aspect of the present invention, symbol symmetries of modulation schemes, e.g., phase shift keying (PSK) modulations, are used to make the calculations even more efficient.

According to a first exemplary embodiment, the calculation of the delta metrics is partitioned into six metric terms (or four metric terms when the symbols have constant modulus), all depending on hypothesized sent data. As recognized by Applicants, one set of metric terms will be common for old states and another set of metric terms has no impact on the selection of survivor states. The former observation implies that one part of the delta metrics can directly be added to the old survivor metrics, while the latter observation implies that one part can be added to the survivor metrics after the selection of survivor states. In comparison with the known partial Ungerboeck approach, this exemplary embodiment significantly reduces the computational load associated with the accumulation of metrics, e.g., by approximately a factor of two when considering an exemplary radiocommunication system or terminal employing two tap channels and 8-PSK modulation.

A generalized method for detecting according to the present invention includes the steps of: adding a first set of metric terms to a plurality of survivor metrics associated with a previous sample index to generate a first set of partially accumulated metrics; adding a second set of metric terms to each partially accumulated metric in said first set of partially accumulated metrics to generate a second set of partially accumulated metrics and selecting one of a plurality of states as a survivor state based on a comparison of said partially accumulated metrics in said second set; and adding a third set of metric terms to each partially accumulated metric in said second set of partially accumulated metrics to generate a plurality of survivor metrics associated with a current sample index.

According to another exemplary embodiment, symmetries associated with the modulation employed can be used to reduce the amount of calculations even further and also decrease the storage requirements associated with metric accumulation. These effects are particularly significant when the hardware used to implement the radio stations, e.g., base stations or mobile stations, supports circular buffers and so-called butterfly instructions.

In existing products, the present invention will release computational resources previously employed for MLSE detecting that can be used for new functionality. In future products, the present invention implies that fewer, or cheaper, hardware units can be used and thus reduce the manufacturing cost. The present invention also permits unnecessary computations to be omitted such that other features, e.g., two pass equalization, can be performed resulting in large performance improvements.

BRIEF DESCRIPTION OF THE DRAWINGS

The foregoing objects, features and advantages of the present invention, as well as other features, will be more readily understood upon reading the following detailed description in conjunction with the drawings in which.

DETAILED DESCRIPTION

In the following description, for purposes of explanation and not limitation, specific details are set forth, such as particular circuits, circuit components, techniques, etc. in order to provide a thorough understanding of the present invention. However, it will be apparent to one skilled in the art that the present invention may be practiced in other embodiments that depart from these specific details. In other instances, detailed descriptions of well-known methods, devices, and circuits are omitted so as not to obscure the description of the present invention.

The exemplary radio communication systems discussed herein are described as using the time division multiple access (TDMA) protocol, in which communication between the base station and the mobile terminals is performed over a number of time slots. However, those skilled in the art will appreciate that the concepts disclosed herein find use in other protocols, including, but not limited to, frequency division multiple access (FDMA), code division multiple access (CDMA), or some hybrid of any of the above protocols. Likewise, some of the exemplary embodiments provide illustrative examples relating to the EDGE/GSM system, however, the techniques described herein are equally applicable to radio base stations and terminals in any system. Moreover, application of the present invention can be made to any implementation of sequence estimation techniques involving the accumulation of metrics, including those which are outside of the radiocommunication area.

Figure 1:
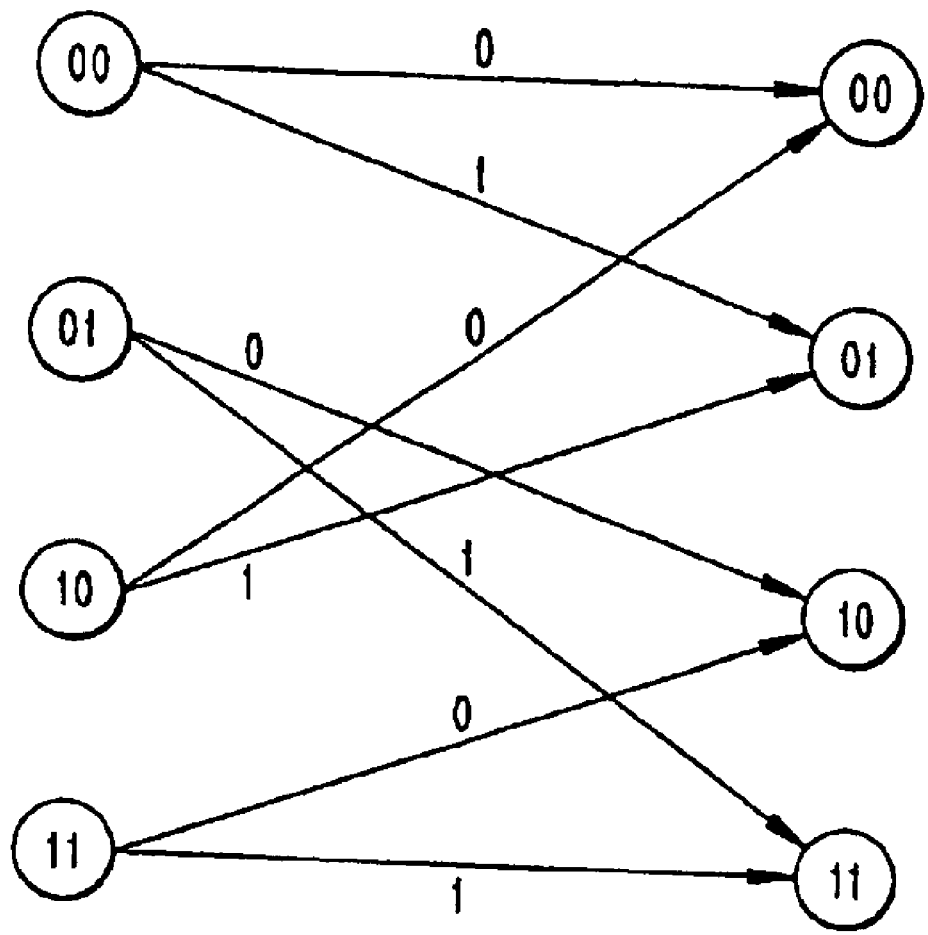
FIG. 1 depicts a portion of a trellis diagram used to explain aspects of sequence estimation algorithms.
Figure 2:
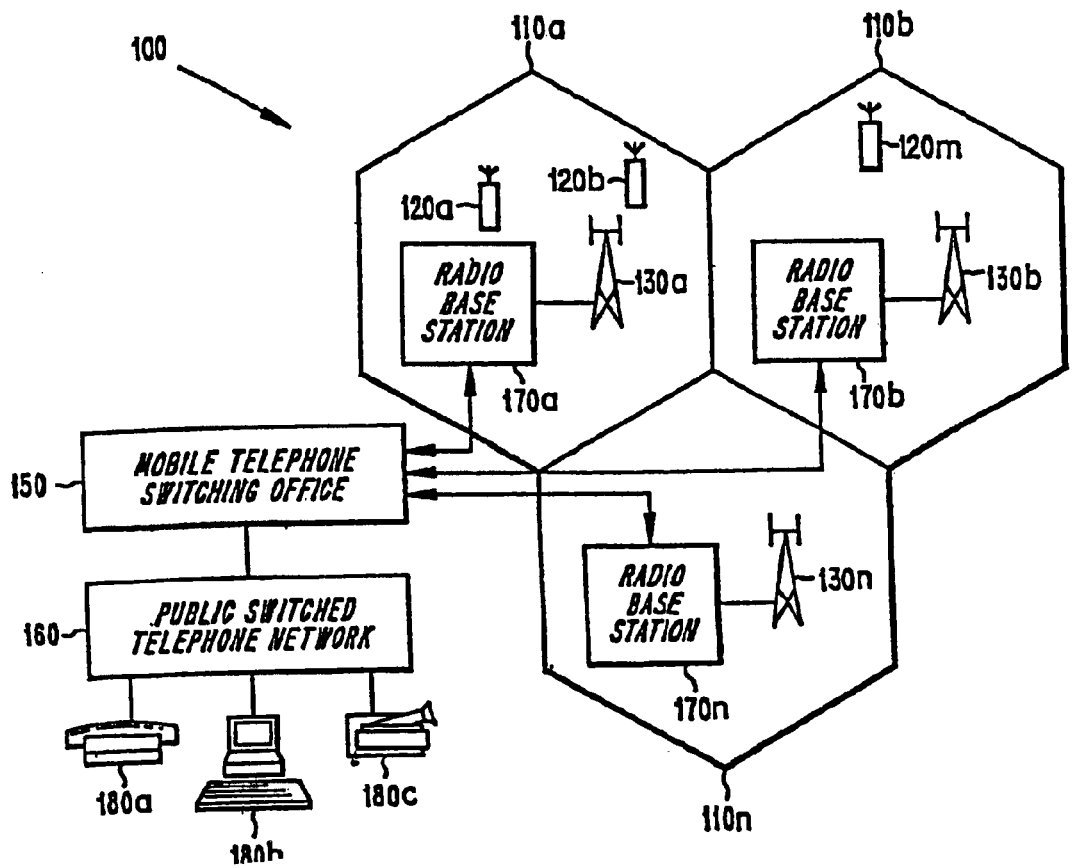
FIG. 2 shows a conventional radiocommunication system including plural base stations and a mobile telephone switching office.

FIG. 2 illustrates an example of a conventional cellular radio communication system 100. The radio communication system 100 includes a plurality of radio base stations 170a–n connected to a plurality of corresponding antennas 130a–n. The radio base stations 170a–n in conjunction with the antennas 130a–n communicate with a plurality of mobile terminals (e.g. terminals 120a, 120b and 120m) within a plurality of cells 110a–n. Communication from a base station to a mobile terminal is referred to as the downlink, whereas communication from a mobile terminal to the base station is referred to as the uplink.

The base stations are connected to a mobile telephone switching office (MSC) 150. Among other tasks, the MSC coordinates the activities of the base stations, such as during the handoff of a mobile terminal from one cell to another. The MSC, in turn, can be connected to a public switched telephone network 160, which services various communication devices 180a, 180b and 180c. Both the mobile terminals 120a, 120b, and 120m, and the base stations 170a–n can incorporate detecting structures and techniques according to the present invention.

Figure 3:
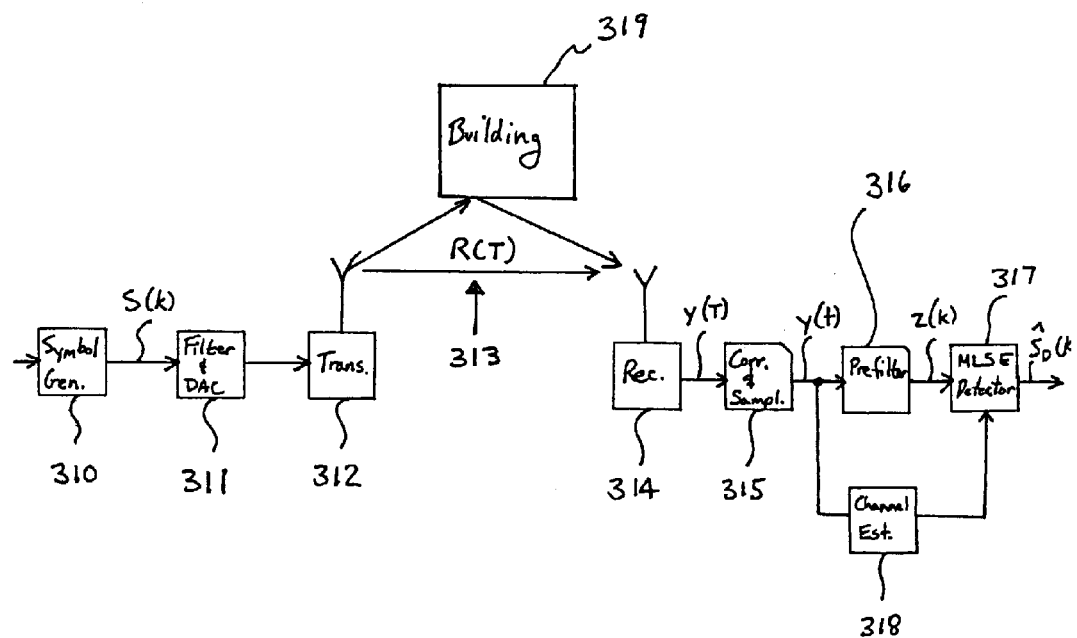
FIG. 3 is a block diagram representation of a radiocommunication system which transmits and receives information over a time dispersive channel.

FIG. 3 illustrates schematically a radio transmission system for signal transmission over a time dispersive channel. A transmitter includes a unit 310 which receives an information carrying signal and generates corresponding digital symbols S(k). These symbols are delivered to a processing unit 311 which includes an output transmitter filter and a digital/analog converter. The symbols S(k) are signal processed in the unit 311 and output to a radio transmitter 312, which transmits the analog signal in the form of a signal R(T) at a selected carrier frequency. The analog signal is transmitted over a radio channel 313 to a radio receiver 314. The channel 313 subjects the signal R(T) to multipath propagation (among other things), as indicated in FIG. 3 by the double signal paths. The signals travelling along one signal path are reflected against, for instance, a building 319 prior to reaching the receiver. The radio receiver 314 demodulates the received signal to baseband and delivers a baseband signal y(T) to a correlating and sampling circuit 315. In turn, the correlating and sampling circuit 315 delivers an observed sampled signal referenced y(t). The signal y(t) is received by a prefilter circuit 316 which outputs a prefiltered, observed signal z(k) to an MLSE detector 317. The signal z(k) is processed in the MLSE detector 317 in accordance with a sequence estimation algorithm, e.g., the viterbi algorithm, and delivers estimated symbols $\hat{S}_D(k)$, which should correspond to the transmitted symbols S(k). The MLSE detector 317 will determine the estimated symbols based, at least in part, on the accumulated metrics discussed below. The correlating and sampling circuit 315 is also connected to a channel estimation circuit 318 and delivers thereto the initial values of a channel estimate which can be adaptively updated in detector 317 for use in the metric calculators. The selection of the correct proposed symbol sequence depends on the accumulated metric associated with each path tested by the detector. In this example, an accumulated path metric is generated for each symbol received. Each symbol received alters the assessment of the possible paths through the trellis. Hence, for each symbol received, a metric associated with the detector's level of certainty of the value, e.g., 0 or 1, of that symbol is conditionally added to the accumulated path metric. As mentioned above, it continues to be desirable to reduce the computational complexity associated with the task of calculating and accumulating metrics in MLSE detector 317. To do so, it is useful to understand how these metrics are calculated at a more detailed level.

To generalize, in a single branch case (i.e. no diversity) and with a mobile radio channel of L taps, defined by:

$$h(0), h(1), \ldots, h(L-1), \tag{1}$$

(where those skilled in the art will appreciate that the channel can be time-varying, although the time indices are omitted here to simplify the notation), the prediction error at sample index n of the sampled signal r(n) is formed as:

$$\varepsilon(n) = r(n) - \sum_{i=0}^{L-1} h(i)s(n-i) \tag{2}$$

where s(n−i) denotes hypothesized transmitted data associated with sample index n−i. With a symbol alphabet of length α, there will be $\alpha^L$ prediction errors constructed from combinations of the sequence s(n), s(n−1), . . . , s(n−L+1). The corresponding $\alpha^L$ squared prediction errors are the metrics discussed above.

The Viterbi algorithm (which is the exemplary sequence estimation algorithm used to illustrate the present invention in this specification) takes into account that the prediction error ε(n+1) is independent of s(n−L+1). Hence, decisions associated with this hypothesis can be performed at sample index n. The $\alpha^{L-1}$ states of the Viterbi trellis are formed from the combinations of the hypothesized data sequence inside the bracket in:

$$\{s(n), \ldots, s(n-L+2), \underline{s(n-L+1)}\} \tag{3}$$

Into each state, there will be a paths of which only one will survive. Furthermore, each state k associates with an accumulated metric $J_n(k)$, k=1, 2, . . . , $\alpha^{L-1}$.

Thus, at each iteration n, the following delta metrics (i.e., the metric to be added to the accumulated metric) are used in the Viterbi algorithm:

$$M = \left(r(n) - \sum_{i=0}^{L-1} h(i)s(n-i)\right)^* \left(r(n) - \sum_{i=0}^{L-1} h(i)s(n-i)\right) \tag{4}$$

where * denotes complex conjugation. By introducing the variables:

$$g(i, i) = |h(i)|^2, f(i) = r(n)h(i)^*, i=0, 1, \ldots, L-1 \tag{5}$$

$$g(i, j) = h(i)h(j)^*, i=0, 1, \ldots, L-2, j=i+1, \ldots, L-1, \tag{6}$$

the delta metrics (4) can equivalently be expressed as:

$$M = |r(n)|^2 + \sum_{i=0}^{L-1} g(i, i)|s(n-i)|^2 - \tag{7}$$

$$2 \sum_{i=0}^{L-1} \text{Re}\{f(i)s(n-i)*\} + 2 \sum_{i=0}^{L-2} \sum_{j=i+1}^{L-1} \text{Re}\{g(i, j)s(n-i)*s(n-j)\}$$

using the fact that x*y+xy*=2Re{x*y}. As identified by Ungerboeck, and as applied in U.S. Pat. No. 5,499,272, it is clear that the term $|r(n)|^2$ in equation (7) is independent of the symbol hypothesis. Thus, this term in equation (7) can be omitted to reach the simplified, "partial Ungerboeck" representation of the delta metrics.

As can also be noticed from equation (7), the "partial Ungerboeck" representation can be further simplified for PSK modulation schemes where symbols have constant modulus, $|s(n-i)|^2=1$. Then the second term on the right hand side of equation (7) will be independent of the hypothesis, and can thus also be omitted. To better understand how metrics can be accumulated using the conventional partial Ungerboeck metrics, consider the following example for a communication system employing 8PSK modulation.

Let M(k, p) denote the delta metric (the two first terms on the right hand side of (7) are omitted) associated with a state transition from state p to state k. The accumulation of metrics for a conventional partial Ungerboeck scheme involving 8PSK modulation and a channel of two taps can be performed by the following pseudocode:

for k=1 to 8
  for p=1 to 8

$$M(k, p) = -2(Re\{f(0)e^{-j(k-1)\pi/4}\} + Re\{f(1)e^{-j(p-1)\pi/4}\}) + 2Re\{g(0, 1)e^{-j(k-1)\pi/4}e^{j(p-1)\pi/4}\} \tag{8}$$

end $$J_n(k) = \min(\{J_{n-1}(1)+M(k, 1), \ldots, J_{n-1}(8)+M(k, 8)\}) \tag{9}$$

end

However, Applicants have recognized that further simplifications are possible. These simplifications will now be described according to an exemplary embodiment of the present invention. Beginning with the partial Ungerboeck form (i.e., equation (7) with $|r(n)|^2$ omitted), the delta metrics are partitioned into a plurality of metric terms according to the present invention as:

$$M^1 = A_1 + A_2 - 2(B_1 + B_2 + C_1 + C_2) \tag{10}$$

where:

$$A_1 = \sum_{i=0}^{L-2} g(i, i)|s(n-i)|^2 \quad (11)$$

$$A_2 = g(L-1, L-1)|s(n-L+1)|^2 \quad (12)$$

$$B_1 = \sum_{i=0}^{L-2} Re\{f(i)s(n-i)*\} \quad (13)$$

$$C_1 = -\sum_{i=0}^{L-2} \sum_{j=i+1}^{L-2} Re\{g(i, j)s(n-i)*s(n-j)\} \quad (14)$$

$$C_2 = -\sum_{i=0}^{L-2} Re\{g(i, L-1)s(n-i)*s(n-L+1)\} \quad (15)$$

Partitioning the metric calculations into these six terms permits them to be selectively calculated and added at different times relative to identifying survivor paths and making symbol (or bit) decisions as part of the sequence estimation algorithm, e.g., in the MLSE detector. For example, note that the terms $A_1$, $B_1$ and $C_1$ are independent of the hypothesis s(n−L+1), which implies that they have no impact on the selection of survivor paths. More specifically, $A_1$, $B_1$ and $C_1$ as partitioned above are scalar quantities that will be added to all of the possible paths and, therefore, only impact the size of the accumulated metric for the selected path rather than the identity of the path to be selected. Thus, Applicants have recognized that these terms can be added to the accumulated metrics after the selection of survivors.

Moreover, the terms $A_2$ and $B_2$ are independent of the states, which implies that they can be added directly to the old survivor metrics (i.e., the accumulated metrics up to sample index n−1), before state transition decisions are conducted. Partitioning the metric calculations as described above and recognizing these qualities of various metric terms, permits those terms to be recalculated less frequently than in conventional metric accumulation techniques.

To further illustrate this aspect of the present invention, an example will now be provided which illustrates how the Viterbi scheme will operate when metric computations are partitioned and selectively accumulated as set forth above. For the purpose of this example, consider 8-PSK modulation and L=2, i.e. two tap channels. Those skilled in the art will appreciate that the present invention is equally applicable to different types of modulations and different numbers of channel taps. In this example, the number of states is then given by $8^{L-1}=8$ and the total number of delta metrics to compute are $8^L=64$. Thus, each state is associated with 8 delta metrics. For 8-PSK modulation, hypothesized data (symbols) belong to:

$$s(n) \in \{e^{j(k-1)\pi/4}, k=1, 2, \ldots, 8\} n=1, 2, \ldots, N \quad (16)$$

A characteristic of PSK-modulation schemes is that the symbols have constant modulus $|s|^2=1$. This implies that the delta metric terms $A_1$ and $A_2$ are independent of the hypothesized data and can thus be omitted in the delta metric equation (10). This provides the following reduced expression for the delta metrics according to this example:

$$M'^N = B_1 + B_2 + C_1 + C_2 \quad (17)$$

Note from equation (10) that minimizing the sum of M's is now equivalent to maximizing the sum of M''s, with respect to hypothesized symbols for this 8-PSK example.

Figure 4A:
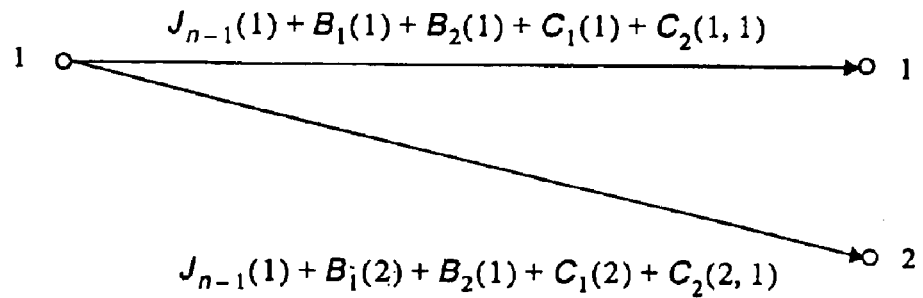
FIGS. 4(a) and 4(b) depict exemplary state transitions and metrics associated therewith.
Figure 4B:
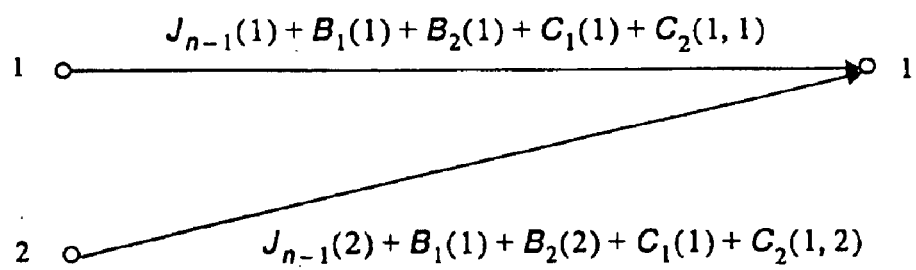

Given that $A_1$ and $A_2$ are not needed in this example, the partitioned delta metric computations for this example become:

$$B_1(k) = Re\{f(0)e^{-j(k-1)\pi/4}\} \quad (18)$$

$$B_2(k) = Re\{f(1)e^{-j(k-1)\pi/4}\} \quad (19)$$

$$C_1(k) = 0 \quad (20)$$

$$C_2(k, p) = -Re\{g(0, 1)e^{-j(k-1)\pi/4}e^{j(p-1)\pi/4}\} \quad (21)$$

where the state index p associates with the hypothesis s(n−1). This partitioning can be conceptually understood by referring to FIGS. 4(a) and 4(b). In FIG. 4(a), it can be observed that the accumulated metrics for the state transitions have two terms in common, $J_{n-1}(1)$ and $B_2(1)$. Hence, these terms can be added before the total metrics are calculated since they appear for all transitions from state one to all other possible states. The same principle can be applied to state transitions from the other states. In FIG. 4(b), it can be observed that the metric terms $B_1(1)$ and $C_1(1)$ are common for the states entering state 1. Hence, when comparing accumulated metrics, these two terms will have no impact at all on the outcome of the decisions, i.e., $$(J_{n-1}(1) + B_1(1) + B_2(1) + C_1(1) + C_2(1, 1)) - \quad (22)$$
$$(J_{n-1}(2) + B_1(1) + B_2(2) + C_1(1) + C_2(1, 2)) =$$
$$J_{n-1}(1) + B_2(1) + C_2(1, 1) - (J_{n-1}(2) + B_2(2) + C_2(1, 2)).$$

However, these two terms are part of the updated survivor metric $J_{n-1}(1)$, so they have to be added after the state transition decisions. Using these concepts, the accumulated metrics according to an exemplary embodiment of the present invention can be calculated according to the following pseudo code:

1. Before decision
   for p=1 to 8

$$J_{n-1}(p) = J_{n-1}(p) + B_2(p)$$

end

2. Decisions
   for k=1 to 8

$$J_n(k) = \max(\{J_{n-1}(1) + C_2(k, 1), \ldots, J_{n-1}(8) + C_2(k, 8)\}) \quad (24)$$

end

3. After decisions
   for k=1 to 8

$$J_n(k) = J_n(k) + B_1(k) + C_1(k) \quad (25)$$

end

Above, the term $J_{n-1}$ is the accumulated metrics at sample index n−1. Since $C_1(k)=0$ it can of course be omitted in the pseudo code provided above, but has been included to emphasize its impact in general on the metric calculations. It will be apparent to those skilled in the art that by breaking up the metric accumulations in this manner, a significant reduction in the number of computations performed during the accumulation of metrics is achieved.

Figure 5:
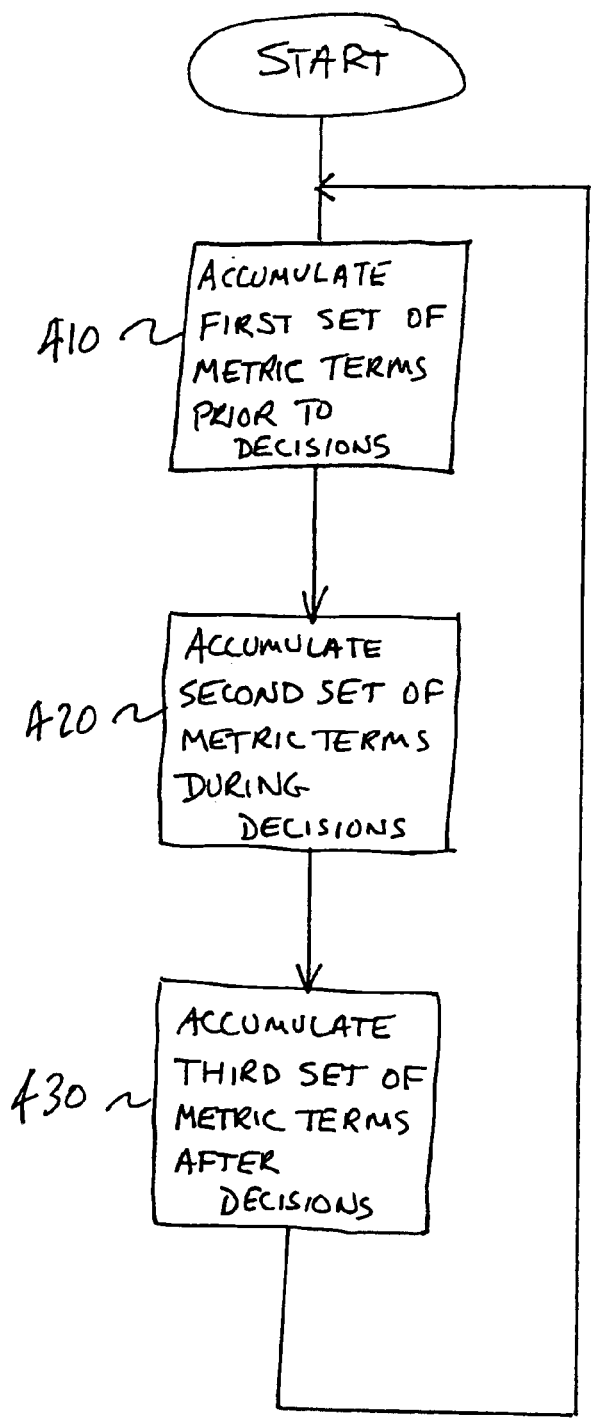
FIG. 5 is a flowchart depicting an exemplary method for accumulating metrics according to an exemplary embodiment of the present invention.
Figure 6:
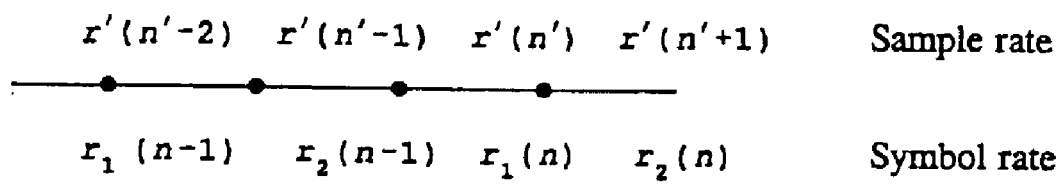
FIG. 6 depicts oversampling associated with a fractionally spaced receiving design according to another exemplary embodiment of the present invention.

From the foregoing pseudo code example, it will be appreciated that partitioning the delta metrics into the terms described above permits accumulating those metrics in various phases, which in turn results in a reduction of the computational complexity associated with MLSE detecting. A generalized method for detecting according to the present invention is illustrated by the flowchart of FIG. 5. Therein, at step 410, only a first set of metric terms is accumulated before selecting a path through a particular state. In the foregoing example, this first set would consist of delta metric term $B_2$, although for other types. of modulation the first set may include other delta metric terms.

At step 420, while decisions are being made, the method operates on a second set of metric terms, e.g., term $C_2$. Lastly, at step 430, the method accumulates a third set of terms, e.g., $B_1$ and $C_1$ (or just $B_1$), after path decisions are made.

When calculating all the delta metric terms in equations (11) to (16), the number of calculations can be further reduced by taking symmetries of the hypothesis into account. This will here be demonstrated for the 8-PSK modulation and two tap channels (L=2) studied in the above example.

The 8-PSK symbol alphabet of equation (17) can be expressed as:

$$s \in \{1, je^{-j\pi/4}, j, -e^{-j\pi/4}, -1, -je^{-j\pi/4}, -j, e^{-j\pi/4}\} \quad (26)$$

Now, introduce the conjugated 8-PSK symbol alphabet $$s^* \in \{1, e^{-j\pi/4}, j, -je^{-j\pi/4}, -1, -e^{-j\pi/4}, j, je^{-j\pi/4}\} \quad (27)$$

and the following $\pi/4$ de-rotated variables:

$$\overline{f(i)} = f(i)e^{-j\pi/4}, i=0, 1, \overline{g(0,1)} = g(0,1)e^{-j\pi/4} \quad (28)$$

with f(i) and g(0, 1) being defined in equations (5) and (6).

Next, consider $B_1(k)$ and $B_2(k)$ specified in equations (19) and (20), respectively. By using (28) and (29), these variables can be expressed in a vector representation as:

$$\begin{bmatrix} B_{i+1}(1) \\ B_{i+1}(2) \\ B_{i+1}(3) \\ B_{i+1}(4) \\ B_{i+1}(5) \\ B_{i+1}(6) \\ B_{i+1}(7) \\ B_{i+1}(8) \end{bmatrix} = \mathrm{Re} \begin{pmatrix} \begin{bmatrix} f(i) \\ \overline{f(i)} \\ -jf(i) \\ -j\overline{f(i)} \\ -f(i) \\ -\overline{f(i)} \\ jf(i) \\ j\overline{f(i)} \end{bmatrix} \end{pmatrix} = \begin{bmatrix} \mathrm{Re}\{f(i)\} \\ \mathrm{Re}\{\overline{f(i)}\} \\ \mathrm{Im}\{f(i)\} \\ \mathrm{Im}\{\overline{f(i)}\} \\ -\mathrm{Re}\{f(i)\} \\ -\mathrm{Re}\{\overline{f(i)}\} \\ -\mathrm{Im}\{f(i)\} \\ -\mathrm{Im}\{\overline{f(i)}\} \end{bmatrix} \quad i=0,1. \quad (29)$$

Evidently, all the values readily follow from the real and the imaginary parts of the variables f(i) and $\overline{f(i)}$. If, for example, a digital signal processor (DSP) supports butterfly instructions, the number of loops (cycles) required in the calculations of $J_{n-1}(p)$ in equation (24), or $J_n(k)$ in equation (26), can be reduced with a factor of two, as illustrated below:

for p=1 to 4

$$J_{n-1}(p) = J_{n-1}(p) + B_2(p)$$

$$J_{n-1}(p+4) = J_{n-1}(p+4) - B_2(p) \quad (30)$$

end

Continuing with delta metric term $C_2(k, p)$ specified by equation (22). By using equations (27) and (29), these variables can, in a vector representation, be expressed as:

$$\begin{bmatrix} C_2(k,1) \\ C_2(k,2) \\ C_2(k,3) \\ C_2(k,4) \\ C_2(k,5) \\ C_2(k,6) \\ C_2(k,7) \\ C_2(k,8) \end{bmatrix} = -\mathrm{Re} \left\{ \begin{bmatrix} g(0,1) \\ \overline{jg(0,1)} \\ jg(0,1) \\ -\overline{g(0,1)} \\ -g(0,1) \\ -\overline{jg(0,1)} \\ -jg(0,1) \\ \overline{g(0,1)} \end{bmatrix} e^{-j(k-1)\pi/4} \right\} \quad (31)$$

from which we first note that:

$$C_2(k, p) = -C_2(k, p+4) \; p=1, \ldots, 4 \quad (32)$$

$$C_2(k, p) = -C_2(k, +4, p) \; k=1, \ldots, 4 \quad (33)$$

These symmetries assure that butterfly structures can be used in calculation of $J_n(k)$ in (25). By evaluating (32) for k=1, it follows that:

When considering D antennas and fractional spaced sampling in general, the number of vector elements will be K=D×U.

In the multi-branch case, the expression for the delta metrics of equation (4) is replaced by:

$$M = (r(n) - \hat{r}(n))^* W (r(n) - \hat{r}(n)) \quad (37)$$

where W is a K×K hermitian matrix that weights the different branches, r(n) is the received signal vector of K elements and $\hat{r}(n)$, with elements defined by:

$$\hat{r}_m(n) = \sum_{i=0}^{L-1} h_m(i) s(n - L + 1) \quad m = 1, 2, \ldots, K \quad (38)$$

Above, the * denotes both conjugation and transpose.

By expressing equation (39) in a matrix form according to:

$$\begin{bmatrix} \hat{r}_1(n) \\ \ldots \\ \hat{r}_K(n) \end{bmatrix} = \begin{bmatrix} h_1(0) & \ldots & h_1(L-1) \\ \ldots & \ldots & \ldots \\ h_K(0) & \ldots & h_K(L-1) \end{bmatrix} \begin{bmatrix} s(n) \\ \ldots \\ s(n+L-1) \end{bmatrix} = HS, \quad (39)$$

where the K×L matrix H contains the channel taps $h_m(i)$ and where the vector S contains the hypothesized data, the delta metrics in equation (38) can be written as:

$$M = r^* W r + S^* H^* W H S - 2\mathrm{Re}\{S^* H^* W r\} \quad (40)$$

By introducing the matrix:

$$H * W H = \begin{bmatrix} g(0,0) & g(0,1) & \ldots & g(0,L-1) \\ g(0,1)* & g(1,1) & & \\ & & \ldots & \\ g(0,L-1)* & & & g(L-1,L-1) \end{bmatrix} \quad (41)$$

and the vector:

$$H * W r \equiv \begin{bmatrix} f(0) \\ \ldots \\ f(L-1) \end{bmatrix}, \quad (42)$$

the delta metrics of equation (38) can equivalently be expressed as $$M = r*Wr + \sum_{i=0}^{L-1} g(i,i)|s(n-i)|^2 - \qquad (43)$$

$$2\sum_{i=0}^{L-1} \text{Re}\{f(i)s(n-i)*\} + 2\sum_{i=0}^{L-2}\sum_{j=i+1}^{L-1} \text{Re}\{g(i,j)s(n-i)*s(n-j)\}$$

By comparing this equation (44) with equation (7), it is evident that they are of same structure. Hence, the same procedure partitioning and accumulation techniques described above for single branch, symbol spaced systems and terminals can also be applied to multi-branch, fractionally spaced terminals.

In already existing products, the present invention will release computational resources previously employed for MLSE detecting that can be used for new functionality. The inventive techniques can be implemented in a processor, e.g., a DSP, associated with, for example, mobile terminals or base stations. In future products, the present invention implies that fewer, or cheaper, hardware units can be used and thus reduce the manufacturing cost. It also implies that unnecessary computations can be released such that e.g., two pass equalization can be performed, resulting in large performance improvements.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A method, employed in a radiocommunication system, for accumulating metrics associated with a sequence estimation process comprising the steps of:
   adding a first set of metric terms to a plurality of survivor metrics associated with a previous index to generate a first set of partially accumulated metrics;
   adding a second set of metric terms to each partially accumulated metric in said first set of partially accumulated metrics to generate a second set of partially accumulated metrics and selecting one of a plurality of states as a survivor state based on a comparison of said partially accumulated metrics in said second set; and
   adding a third set of metric terms to each partially accumulated metric in said second set of partially accumulated metrics to generate a plurality of survivor metrics associated with a current index in order to estimate a transmitted symbol sequence.

2. The method of claim 1, wherein said first, second and third set of metric terms are taken from the following delta metric equation:

$$M = |r(n)|^2 + \sum_{i=0}^{L-1} g(i,i)|s(n-i)|^2 -$$

$$2\sum_{i=0}^{L-1} \text{Re}\{f(i)s(n-i)^*\} + 2\sum_{i=0}^{L-2}\sum_{j=i+1}^{L-1} \text{Re}\{g(i,j)s(n-i)^*s(n-j)\}$$

wherein r(n) is the sampled signal; s(n−i) denotes hypothesized transmitted data associated with sample index n−i; L is the number of mobile phone channel taps, j is a $j^{th}$ channel tap and f and g are channel estimates.

3. The method of claim 2, wherein said first set of metric terms includes scalar quantities $A_2$ and $B_2$ where:

$$A_2 = g(L-1, L-1)|s(n-L+1)|^2$$

$$B_2 = \text{Re}\{f(L-1)s(n-L+1)^*\}.$$

4. The method of claim 3, wherein the radiocommunication system uses a modulation having a constant modulus and said first set of metric terms includes only $B_2$.

5. The method of claim 2, wherein said second set of metric terms includes scalar quantity $C_2$ where $$C_2 = -\sum_{i=0}^{L-2} \text{Re}\{g(i, L-1)s(n-i)^*s(n-L+1)\}.$$

6. The method of claim 2, wherein said third set of metric terms includes scalar quantities $A_1$ and $B_1$ and $C_1$ where:

$$A_1 = \sum_{i=0}^{L-2} g(i,i)|s(n-i)|^2$$

$$B_1 = \sum_{i=0}^{L-2} \text{Re}\{f(i)s(n-i)^*\} \text{ and}$$

$$C_1 = -\sum_{i=0}^{L-2}\sum_{j=i+1}^{L-2} \text{Re}\{g(i,j)s(n-i)^*s(n-j)\}.$$

7. The method of claim 6, wherein the radiocommunication system uses a modulation having a constant modulus and said third set of metric terms includes only $B_1$ and $C_1$.

8. The method of claim 1, wherein said process of sequence estimation is applied to detect symbols transmitted over a radio channel and wherein said previous index and said current index are sample indices.

9. The method of claim 1, wherein said sequence estimation algorithm is the Viterbi algorithm.

10. A method for processing a radio signal comprising the steps of:
   (a) receiving said signal on at least one antenna;
   (b) sampling said received signal to generate a sampled signal;
   (c) forming channel estimates from said sampled signal;
   (d) selecting:
      a first set of metric terms, based on a decision state of a detector, before a decision is made by said detector;
      a second metric term set when decisions are being made by said detector; and
      a third metric term set after decisions are being made by said detector;
   (e) accumulating said first set of metric terms by adding at least one calculated value of said first set of metric terms to a previously accumulated metric value; and
   (f) estimating a transmitted symbol sequence using a sequence estimation algorithm and said accumulated, first set of metric terms.

11. The method of claim 10, wherein said step of selecting further comprises selecting, as said first set of metric terms, at least one of the terms from the following equation:
wherein r(n) is the sampled signal: s(n−i) denotes hypothesized transmitted data associated with sample index n−i; L is the number of mobile phone channel taps, j is a $j^{th}$ channel tap and f and g are channel estimates $$M = |r(n)|^2 + \sum_{i=0}^{L-1} g(i, i)|s(n-i)|^2 - 2\sum_{i=0}^{L-1} \text{Re}\{f(i)s(n-i)^*\} + 2\sum_{i=0}^{L-2}\sum_{j=i+1}^{L-1} \text{Re}\{g(i, j)s(n-i)^*s(n-j)\}.$$

12. The method of claim 10, wherein said at least one antenna includes two or more antennas.

13. The method of claim 10, wherein said step of sampling further comprises the step of:

sampling said received signal using a period that is less than a symbol period.

14. The method of claim 10, wherein steps (d) and (e) are repeated for each of a plurality of decision states of said detector, with the selection of different metric terms in step (d) prior to reaching step (f).

15. The method of claim 10, further comprising the step of:

calculating a first value of each different metric term in said first set of metric terms directly from an equation and, thereafter, determining subsequent values of said first set of metric terms by adding an offset to said first value.

16. The method of claim 10, further comprising the step of:

calculating a first value of each different metric term in said second set of metric terms directly from an equation and, thereafter, determining subsequent values of said first set of metric terms by adding an offset to said first value.

17. The method of claim 10, further comprising the step of:

calculating a first value of each different metric term in said third set of metric terms directly from an equation and, thereafter, determining subsequent values of said first set of metric terms by adding an offset to said first value.

18. A device for estimating a sequence of values comprising:

a processor which accumulates metrics as part of a process of estimating said sequence of values by performing the functions of:

(a) adding a first set of metric terms to a plurality of survivor metrics associated with a previous index to generate a first set of partially accumulated metrics;

(b) adding a second set of metric terms to each partially accumulated metric in said first set of partially accumulated metrics to generate a second set of partially accumulated metrics and selecting one of a plurality of states as a survivor state based on a comparison of said second set of partially accumulated metrics; and (c) adding a third set of metric terms to each partially accumulated metric in said second set of partially accumulated metrics to generate a plurality of survivor metrics associated with a current index.

19. The device of claim 18, wherein said first, second and third set of metric terms are taken from the following delta metric equation:

$$M = |r(n)|^2 + \sum_{i=0}^{L-1} g(i, i)|s(n-i)|^2 - 2\sum_{i=0}^{L-1} \text{Re}\{f(i)s(n-i)^*\} + 2\sum_{i=0}^{L-2}\sum_{j=i+1}^{L-1} \text{Re}\{g(i, j)s(n-i)^*s(n-j)\}.$$

wherein r(n) is the sampled signal; s(n−i) denotes hypothesized transmitted data associated with sample index n−i; L is the number of mobile phone channel taps, j is a $j^{th}$ channel tap and f and g are channel estimates.

20. The device of claim 18, wherein said first set of metric terms includes the scalar quantities $A_2$ and $B_2$ where:

$B_2 = Re\{f(L-1)s(n-L+1)^*\}$ $A_2 = g(L-1, L-1)|s(n-L+1)|^2.$

21. The device of claim 20, wherein said method is employed in a radiocommunication system that uses a modulation having a constant modulus and said first set of metric terms includes only $B_2$.

22. The device of claim 19, wherein said second set of metric terms includes the scalar quantity $C_2$, where:

$$C_2 = -\sum_{i=0}^{L-2} \text{Re}\{g(i, L-1)s(n-i)^*s(n-L+1)\}.$$

23. The device of claim 19, wherein said third set of metric terms includes the scalar quantities $A_1$, $B_1$ and $C_1$ where:

$$A_1 = \sum_{i=0}^{L-2} g(i, i)|s(n-i)|^2$$

$$B_1 = \sum_{i=0}^{L-2} \text{Re}\{f(i)s(n-i)^*\} \text{ and}$$

$$C_1 = -\sum_{i=0}^{L-2}\sum_{j=i+1}^{L-2} \text{Re}\{g(i, j)s(n-i)^*s(n-j)\}.$$

24. The device of claim 23, wherein said method is employed in a radiocommunication system that uses a modulation having a constant modulus and said third set of metric terms includes only $B_1$ and $C_1$.

25. The device of claim 18, wherein said process of estimating said sequence is applied to detect symbols transmitted over a radio channel and wherein said previous index and said current index are sample indices.

26. The device of claim 18, wherein said sequence estimation algorithm is the Viterbi algorithm.

27. The device of claim 18, wherein said device is a mobile terminal.

28. The device of claim 18, wherein said device is a base station.

* * * * *